United States Patent
Murakami et al.

(10) Patent No.: US 8,753,984 B2
(45) Date of Patent: Jun. 17, 2014

(54) METHOD AND APPARATUS FOR FORMING SILICON NITRIDE FILM

(75) Inventors: Hiroki Murakami, Nirasaki (JP); Yosuke Watanabe, Nirasaki (JP); Kazuhide Hasebe, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 153 days.

(21) Appl. No.: 13/332,691

(22) Filed: Dec. 21, 2011

(65) Prior Publication Data
US 2012/0178264 A1 Jul. 12, 2012

(30) Foreign Application Priority Data
Dec. 21, 2010 (JP) ................................ 2010-284634
Oct. 28, 2011 (JP) ................................ 2011-237988

(51) Int. Cl.
*H01L 21/20* (2006.01)
(52) U.S. Cl.
USPC ................ 438/765; 438/775; 257/E21.24
(58) Field of Classification Search
USPC .......................................... 438/465, 775–777
See application file for complete search history.

(56) References Cited

U.S. PATENT DOCUMENTS

| | | | |
|---|---|---|---|
| 6,806,175 B2* | 10/2004 | Moore | 438/595 |
| 7,172,792 B2* | 2/2007 | Wang et al. | 427/255.393 |
| 7,638,170 B2* | 12/2009 | Li | 427/255.39 |
| 8,455,369 B2* | 6/2013 | Watanabe et al. | 438/763 |
| 2006/0237846 A1* | 10/2006 | Chakravarti et al. | 257/751 |
| 2006/0286774 A1* | 12/2006 | Singh et al. | 438/478 |
| 2006/0286776 A1* | 12/2006 | Ranish et al. | 438/478 |
| 2011/0263105 A1* | 10/2011 | Hasebe et al. | 438/482 |

FOREIGN PATENT DOCUMENTS

| | | |
|---|---|---|
| JP | 7-297182 A | 11/1995 |
| JP | 9-134919 A | 5/1997 |
| JP | 2008-507845 A | 3/2008 |
| JP | 2008-258591 A | 10/2008 |
| JP | 2010-183069 A | 8/2010 |

* cited by examiner

*Primary Examiner* — Savitr Mulpuri
(74) *Attorney, Agent, or Firm* — Nath, Goldberg & Meyer; Jerald L. Meyer

(57) ABSTRACT

A method of forming a silicon nitride film on the surface of an object to be processed, the method including forming a seed layer functioning as a seed of the silicon nitride film on the surface of the object to be processed by using at least an aminosilane-based gas, prior to forming the silicon nitride film on the surface of the object to be processed.

8 Claims, 6 Drawing Sheets

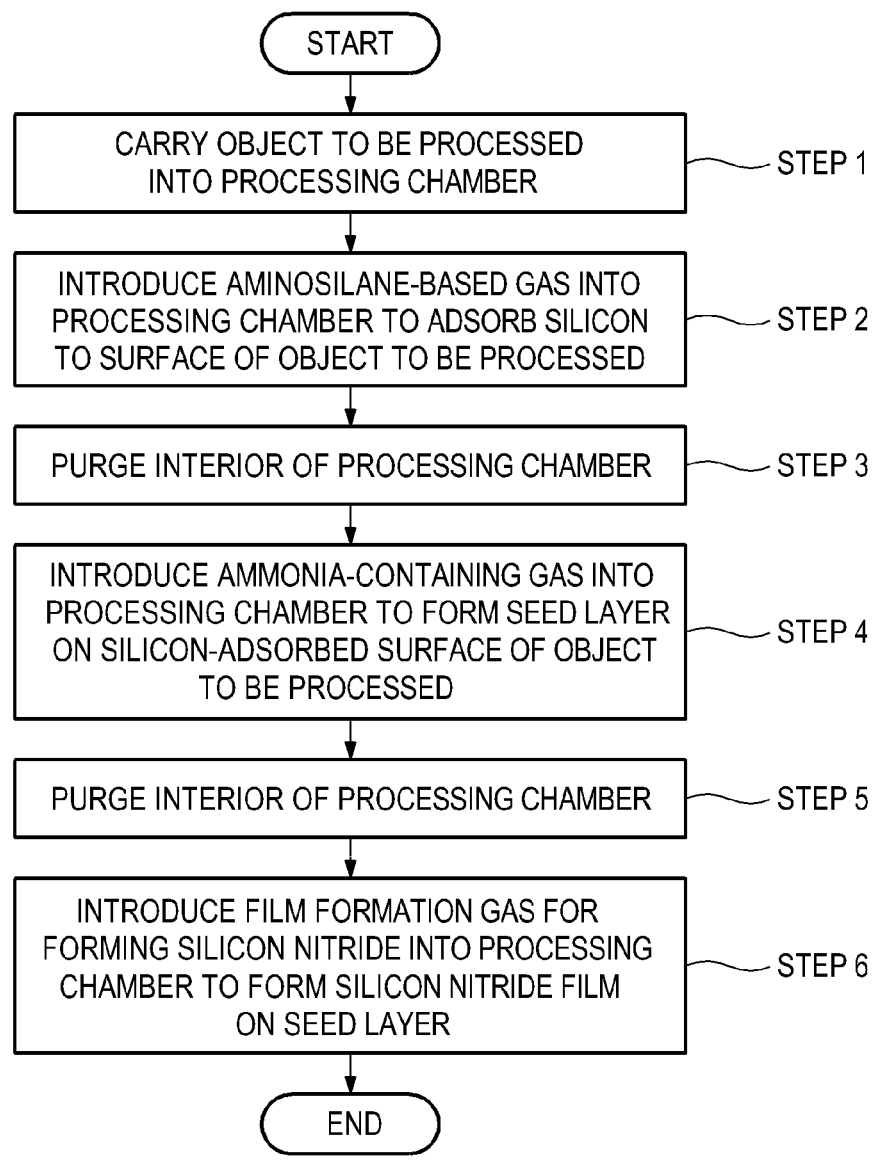

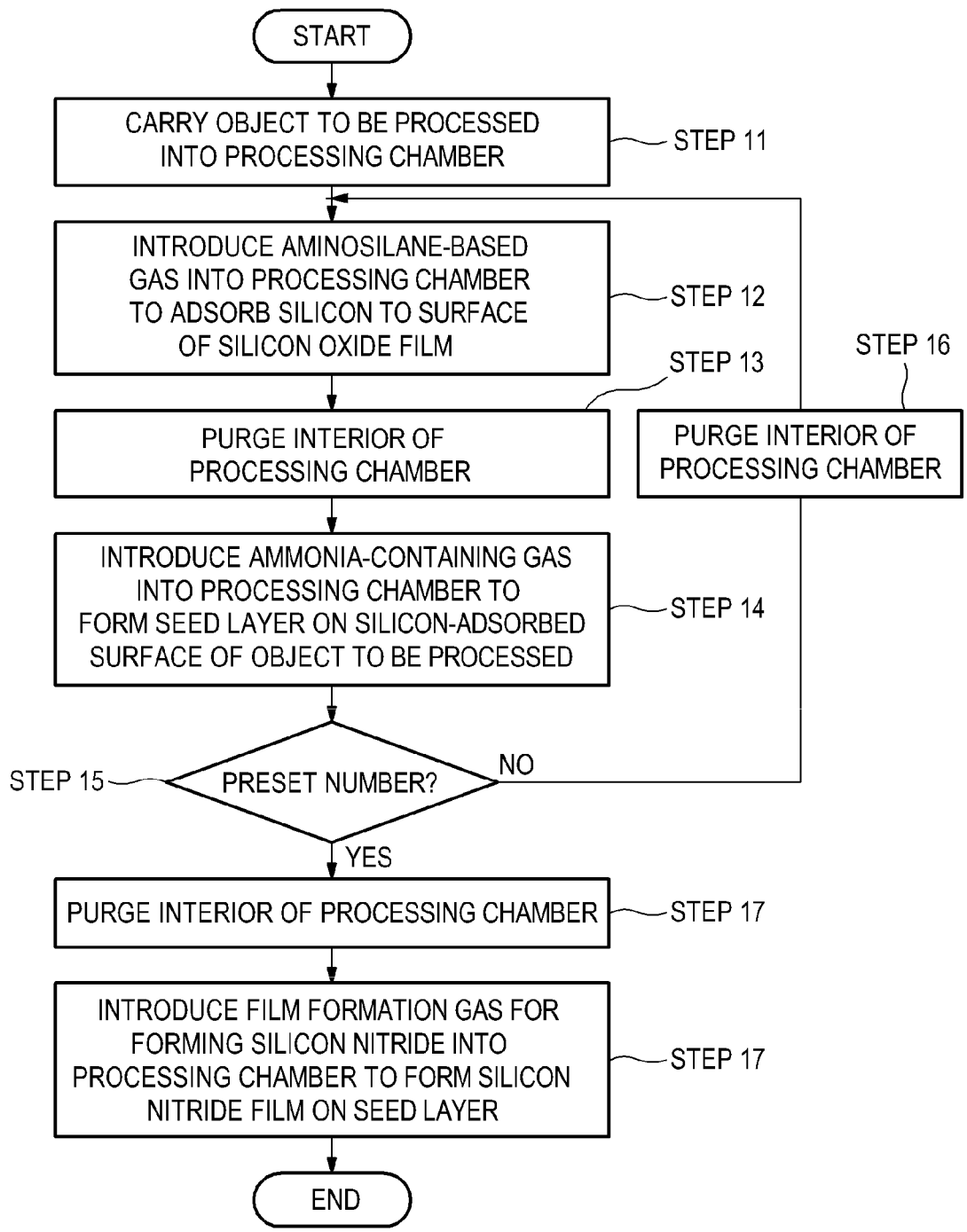

METHOD AND APPARATUS FOR FORMING SILICON NITRIDE FILM

CROSS-REFERENCE TO RELATED APPLICATIONS

This application claims the benefit of Japanese Patent Application Nos. 2010-284634 and 2011-237988, filed on Dec. 21, 2010 and Oct. 28, 2011, respectively, in the Japanese Patent Office, the disclosure of which is incorporated herein in their entirety by reference.

TECHNICAL FIELD

The present disclosure relates to a method and apparatus for forming a silicon nitride film.

BACKGROUND

In forming a nitride silicon film, there is a duration until the film starts to be adhered (hereinafter, referred to as an incubation duration) at an initial stage of the film formation. There is a known example of improving the incubation duration. In such an example, in forming a SiN-based insulating film on an SiO-based insulating film, the SiO-based insulating film is formed under an air-tight atmosphere, and then rapidly thermally nitridated and subjected to CVD in sequence, without performing RCA cleansing, while being maintained in state of being blocked from the atmosphere.

Also, there is a method for forming a silicon-containing film such as a silicon nitride film, or the like through plasma chemical vapor deposition. In this method, an ammonia radical is sufficiently adsorbed to a surface of an object to be processed before the silicon-containing film is formed. Thereafter, a silicon precursor such as aminosilane, or the like is reacted with the ammonia radical to form a silicon nitride.

In forming the silicon nitride film, there is an incubation duration. Thus, at the initial stage of film formation, the silicon nitride film exists in the form of islands, rather than being uniformly attached. Accordingly, the silicon nitride film in a very thin film state has poor step coating characteristics, poor physical characteristics that a film thickness or film quality are not uniform, and poor electrical characteristics such as insulating characteristics.

SUMMARY

According to one embodiment of the present disclosure, provided is a method of forming a silicon nitride film on the surface of an object to be processed, the method comprising: forming a seed layer functioning as a seed of the silicon nitride film on the surface of the object by using at least an aminosilane-based gas, followed by forming the silicon nitride film on the surface of the object.

According to another embodiment, provided is a method of forming a silicon nitride film, the method comprising: (1) carrying an object to be processed into a processing chamber; (2) introducing an aminosilane-based gas into the processing chamber and adsorbing silicon to a surface of the object to be processed; (3) introducing a gas including ammonia into the rocessing chamber and forming a seed layer on the silicon-adsorbed surface of the object to be processed; and (4) introducing a film formation gas for forming a silicon nitride into the processing chamber and forming a silicon nitride film on the seed layer.

According to yet another embodiment of the present disclosure, provided is an apparatus of forming a silicon nitride film, the apparatus comprising: a processing chamber configured to accommodate an object to be processed; and a gas supply mechanism configured to supply a aminosilane-based gas, a gas including ammonia, and a film formation gas for forming a silicon nitride into the processing chamber, wherein the apparatus is configured to execute a method of Claim 1 within the processing chamber.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a flowchart illustrating an example of a method for forming a silicon nitride film according to a first embodiment of the present invention.

FIG. 3 is a flow chart illustrating an example of a method for forming a silicon nitride film according to a second embodiment of the present invention.

DETAILED DESCRIPTION

A first embodiment of the present disclosure will now be described in detail with reference to the drawings.

First Embodiment

FIG. 1 is a flowchart illustrating an example of a method for forming a silicon nitride film according to a first embodiment of the present invention, and FIGS. 2A to 2D are a cross-sectional view showing examples of sections of an object to be processed in the example illustrated in FIG. 1, respectively.

Figure 2A:
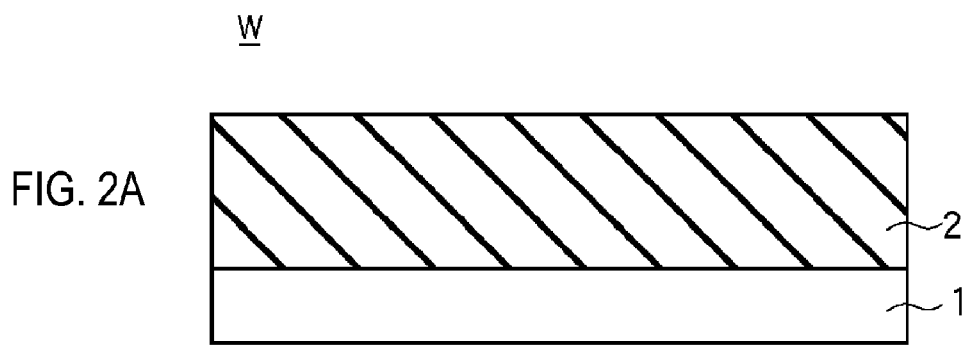
FIGS. 2A to 2D are a cross-sectional view showing examples of sections of an object to be processed in the example illustrated in FIG. 1, respectively.

As shown in step 1 of FIG. 1, the object to be processed is carried into a processing chamber of the film forming apparatus. In this example, the object to be processed is a semiconductor wafer, e.g., a silicon wafer. FIG. 2A illustrates an example of a section of the silicon wafer. In this example, as an example of the object to be processed, a silicon wafer W with, e.g., a silicon oxide ($SiO_2$) film 2, formed on a surface of a silicon substrate 1 is used. Namely, a base of forming a silicon nitride film is the silicon oxide film 2 in this example. However, the silicon oxide film 2 is not limited and silicon having a natural oxide film formed thereon, a metal having a natural oxide film thereon, a metal having no natural oxide film thereon, or the like may also be used as a base. After the object to be processed is carried into the processing chamber of the film forming apparatus, the temperature within the processing chamber is increased to a silicon adsorption temperature (processing temperature). In this example, a silicon adsorption temperature is set to be 450 degrees C.

Figure 2B:
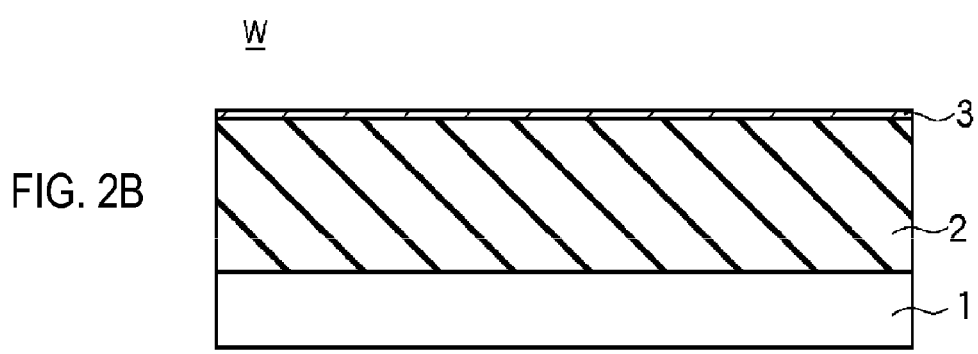

Next, as shown in step 2 of FIG. 1, an aminosilane-based gas is introduced into the processing chamber having the silicon adsorption temperature and silicon is adsorbed to a surface of the silicon oxide film 2. Accordingly, as shown in FIG. 2B, a silicon adsorption layer 3 is formed on the silicon oxide film 2. In this example, a diisopropylaminosilane (DIPAS) is used as an aminosilane-based gas.

Also, processing conditions used in this example are as follows.

DIPAS flow rate: 150 sccm
 Processing time: 60 sec
 Processing temperature: 450 degrees C.
 Processing pressure: 532 Pa (4 Torr)

After the processing is terminated, the interior of the processing chamber is purged by using an inert gas (step 3). In this example, a nitrogen ($N_2$) gas is used as the inert gas.

Figure 2C:
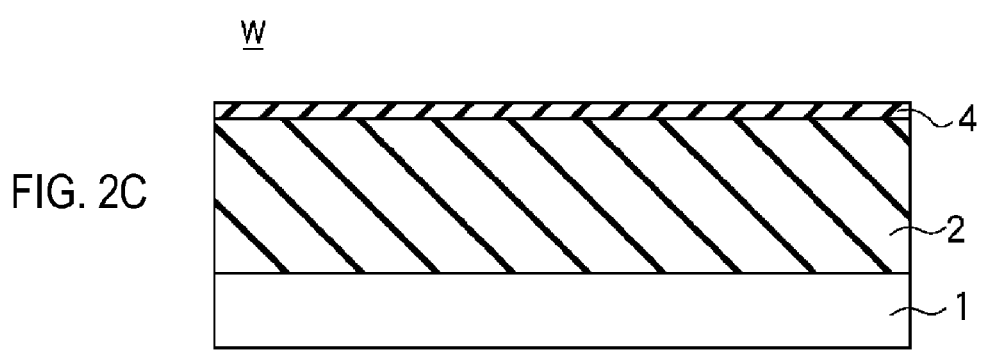

Next, as shown in step 4 of FIG. 1, a gas including ammonia ($NH_3$) is introduced into the processing chamber. Accordingly, an amino group (e.g., $NH_2$) is combined to the silicon adsorption layer 3 to form a seed layer 4 on the surface of the silicon oxide film 2, as shown in FIG. 2C.

Processing conditions used in this example are as follows.

$NH_3$ flow rate: 5000 sccm
 Processing time: 25 min
 Processing temperature: this temperature is increased from 450 degrees C. to 630 degrees C.
 Processing pressure: 66.7 Pa (0.5 Torr).

Also, in this example, as an ammonia gas is introduced into the processing chamber, the temperature within the processing chamber is increased from 450 degrees C. to a silicon nitride film formation temperature, which is 630 degrees C. in this example. By increasing the temperature so high, the reaction between the silicon adsorption layer 3 and the ammonia gas can be accelerated in comparison to the case in which the temperature within the processing chamber is not changed from the silicon adsorption temperature. After the processing is terminated, the interior of the processing chamber is purged by using an inert gas (step 5). In this example, a nitrogen gas is used as an inert gas.

Figure 2D:
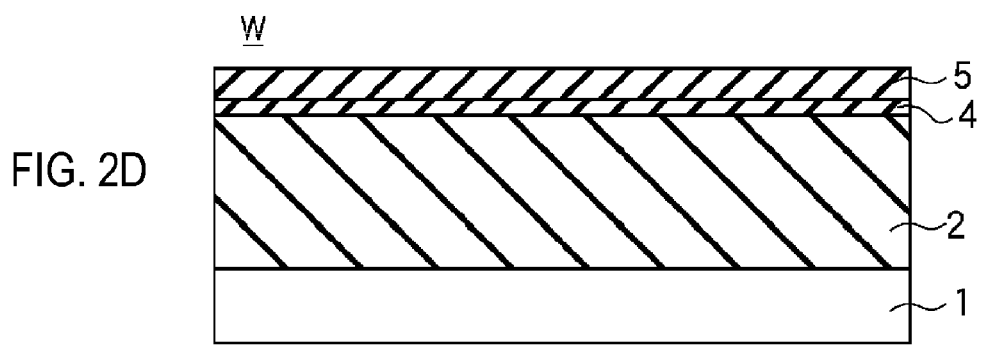

Thereafter, as shown in step 6 of FIG. 1, a film formation gas for forming a silicon nitride is introduced into the processing chamber at the silicon nitride film formation temperature, and as shown in FIG. 2D, a silicon nitride film 5 is formed on the seed layer 4.

In this example, in order to form the silicon nitride film 5, a film forming method of alternately supplying a gas including silicon and a gas including a nitrating agent and depositing a silicon nitride on the seed layer 4 is employed. This film forming method is called an atomic layer deposition (ALD) method or a molecular layer deposition (MLD) method. In this example, a silane-based gas, e.g., dichlorosilane (DCS: $SiH_2Cl_2$), is used as a gas including silicon, and a gas including ammonia is used as a gas including a nitrating agent. In order to form the silicon nitride film 5, first, DCS is introduced into the processing chamber and silicon is adsorbed to the seed layer 4. Subsequently, the interior of the processing chamber is purged with inert gas, e.g., a nitrogen gas, and impurities other than silicon are discharged from the interior of the processing chamber. Thereafter, a gas including ammonia is introduced into the processing chamber to nitrate the adsorbed silicon. And then, the interior of the processing chamber is purged with an inert gas, e.g., a nitrogen gas, and impurities are discharged from the interior of the processing chamber. These processes are repeatedly performed until the silicon nitride film 5 has a desired thickness, thus forming the silicon nitride film 5.

Also, in order to form the silicon nitride film 5, a film forming method, so-called a chemical vapor deposition (CVD) method, of simultaneously supplying a gas including silicon and a gas including a nitrating agent and depositing a silicon nitride on the seed layer 4 may also be employed.

According to this first embodiment, when the silicon nitride film 5 is formed on the base, which is the silicon oxide film 2 in this example, silicon is adsorbed to the surface of the silicon oxide film 2 by using an aminosilane-based gas to form the silicon adsorption layer 3, and an amino group is bonded to the silicon adsorption layer 3 by using an ammonia-containing gas to modify the silicon adsorption layer 3 into the seed layer 4. Thereafter, the silicon nitride film 5 is formed on the seed layer 4. This configuration shortens the incubation duration in comparison to a direct formation of the silicon nitride film 5 on the silicon oxide film 2, as described in more detail later. As a result, a silicon nitride film having excellent physical and electrical properties can be obtained although it is an ultrathin film. In particular, this embodiment increases a step coverage and uniformities of a film thickness or film quality, thereby making it possible to obtain an ultrathin silicon nitride film having electrical insulation properties.

Also, according to the first embodiment, since the incubation duration of the silicon nitride film 5 can be shortened, in particular, a production yield of the process of forming the silicon nitride film can also be improved, for example, in fabricating a semiconductor integrated circuit device.

Second Embodiment

FIG. 3 is a flowchart illustrating an example of a method for forming a silicon nitride film according to a second embodiment of the present invention. Also, as an example of the section of an object to be processed in this example, FIGS. 2A to 2D will be used.

The second embodiment is different from the first embodiment, in that generation of the silicon adsorption layer 3 on the surface of the base and modification of the silicon adsorption layer 3 into the seed layer 4 are performed by repeating the introduction of the aminosilane-based gas and the gas including ammonia a predetermined number of times.

First, as illustrated in step 11 of FIG. 3, in this example, an object to be processed, which is, e.g., a silicon wafer (see FIG. 2A) formed by forming silicon oxide ($SiO_2$) film 2 on a surface of a silicon substrate 1, is carried into the processing chamber of the film forming apparatus, likewise as in the first embodiment. After the object to be processed is carried into the processing chamber of the film forming apparatus, the temperature within the processing chamber is increased to a silicon adsorption temperature (processing temperature). In this example, the silicon adsorption temperature is set to be 550 degrees C., higher than that of the first embodiment. The reason is as follows.

In the first embodiment, after silicon is adsorbed to the surface of the base, the ammonia-containing gas is introduced into the processing chamber while increasing the temperature therein up to a temperature at which the silicon nitride film is formed. Meanwhile, in the second embodiment, the introduction of the aminosilane-based gas and the introduction of the ammonia-containing gas are repeated a predetermined number of times. As such, if the temperature within the processing chamber is increased, e.g., up to the silicon nitride film formation temperature whenever the ammonia-containing gas is introduced into the processing chamber, or if the temperature within the processing chamber is decreased to the silicon adsorption temperature whenever the aminosilane-based gas is introduced into the processing chamber, overall processing time may be lengthened. Thus, to address the lengthened processing time, in one embodiment, the temperature within the processing chamber is set to be equal to that when the aminosilane-based gas is introduced and when the ammonia-containing gas is introduced. This reduces changing the temperature within the processing chamber, which, in turn, shortens the processing time in comparison to the case of changing the temperature within the processing chamber. Also, when the temperature within the processing chamber is not changed from the silicon adsorption temperature, it is anticipated that the reaction between the silicon adsorption layer 3 and the ammonia gas is hardly made. To address this, in one embodiment, the silicon adsorption temperature may be set to be 550 degrees C., higher than that in the first embodiment.

Thereafter, as shown in step 12 of FIG. 3, an aminosilane-based gas is introduced into the processing chamber at the silicon adsorption temperature, and silicon is adsorbed to the surface of the silicon oxide film 2 (FIG. 2B). Accordingly, the silicon adsorption layer 3 is formed on the surface of the silicon oxide film 2. In this example, a tridimethylaminosilane gas (TDMAS) is used as an aminosilane-based gas.

Also, processing conditions used in this example are as follows.
TDMAS flow rate: 150 sccm
Processing time: 15 sec
Processing temperature: 550 degrees C.
Processing pressure: 532 Pa (4 Torr)

After the processing is terminated, the interior of the processing chamber is purged by using an inert gas (step 13). In this example, a nitrogen gas is used as an inert gas.

Thereafter, as shown in step 14 of FIG. 3, a gas including ammonia ($NH_3$) is introduced into the processing chamber. Accordingly, an amino group (e.g., $NH_2$) is bonded to the silicon adsorption layer 3.

Processing conditions used in this example are as follows.
$NH_3$ flow rate: 5000 sccm
Processing time: 20 sec
Processing temperature: 550 degrees C.
Processing pressure: 53.2 Pa (0.4 Torr)

Next, as shown in step 15 of FIG. 3, it is determined whether or not the number of repeated times of introduction of the aminosilane-based gas and the gas including ammonia has reached a preset number.

When the number of repeated times has not reached the preset number (No), the flow proceeds to step 16 in which the interior of the processing chamber is purged by using an inert gas, which is a nitrogen gas in this example, while maintaining the temperature within the processing chamber. Steps 12, 13, and 14 are continuously repeated.

When the number of repeated times has reached the preset number (Yes), the formation of the seed layer 4 is completed (FIG. 2C). In this case, the flow proceeds to step 17, in which the interior of the processing chamber is purged by using an inert gas, which is a nitrogen gas in this example, while increasing the temperature within the processing chamber from the silicon adsorption temperature to the silicon nitride film formation temperature, which is 630 degrees C. in this example.

Thereafter, as shown in step 18 of FIG. 3, a film formation gas for forming a silicon nitride is introduced into the processing chamber at the silicon nitride film formation temperature, and the silicon nitride film 5 is formed on the seed layer 4. Likewise as in the first embodiment, the film forming method for forming the silicon nitride film 5 is the method called the ALD method or the MLD method, and the film formation conditions are the same as those of step 6 in the first embodiment. Also, in the second embodiment, the film formation method is not limited to the ALD method or the MLD method, but a CVD method may be employed.

In this second embodiment, the silicon nitride film 5 is formed on the seed layer 4. Thus, likewise as in the first embodiment, the incubation duration of the silicon nitride film 5 can be advantageously shortened in comparison to the case of forming the silicon nitride film 5 directly on the silicon oxide film 2.

(Incubation Duration)

Next, the incubation duration in the first and second embodiments will be described in comparison to Comparative Example.

Figure 4:
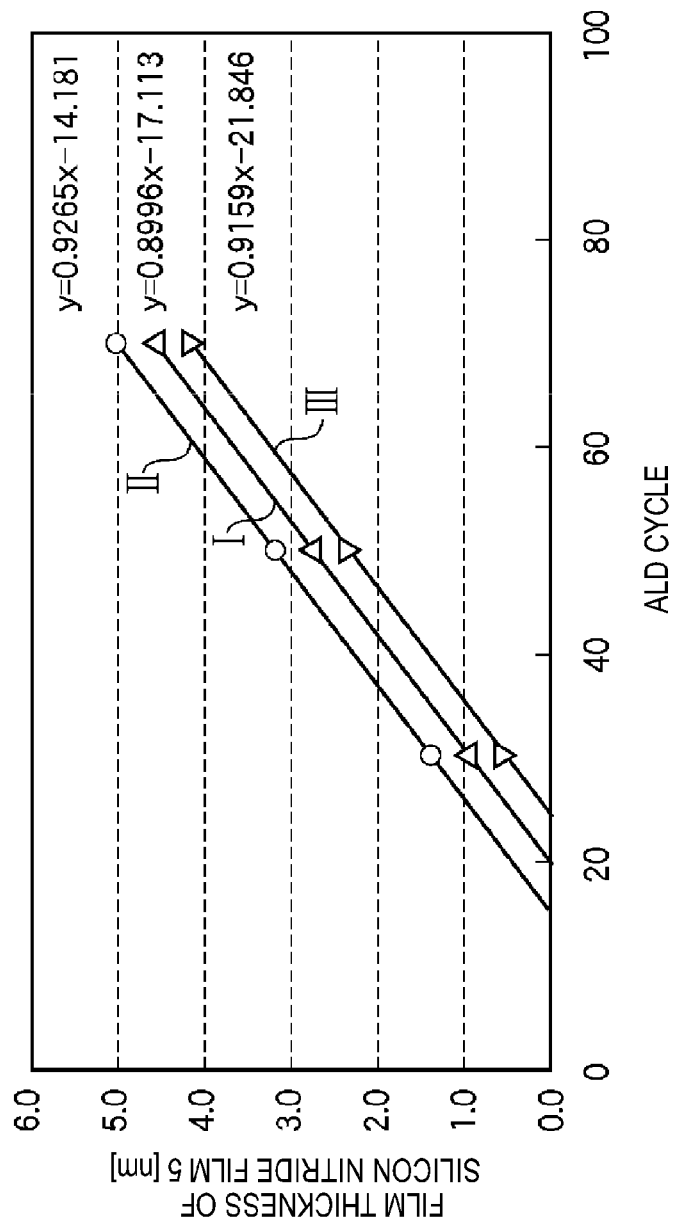
FIG. 4 is a view showing an incubation duration.

FIG. 4 is a view showing an incubation duration. The vertical axis denotes a film thickness of the silicon nitride film 5 and the horizontal axis denotes the number of ALD cycles.

In FIG. 4, line I is obtained in case of forming the silicon nitride film 5 according to the first embodiment, and line II is obtained in case of forming the silicon nitride film 5 according to the second embodiment. Line III is Comparative Example. According to Comparative Example, the silicon nitride film 5 is formed directly on the surface of the base (silicon oxide film 2) by using the method called the ALD method or the MLD method. Film formation conditions are the same as the processing conditions of step 6 in the first embodiment.

The film thickness of the silicon nitride film 5 is measured when the ALD cycles are 30 times, 50 times, and 70 times, respectively. Lines I to III are straight lines obtained by approximating the three measured film thicknesses by using a method of least squares, and corresponding equations are as follows.

$$\text{Line } I: y=0.8996x-17.113 \quad (1)$$

$$\text{Line } II: y=0.9265x-14.181 \quad (2)$$

$$\text{Line } III: y=0.9159x-21.846 \quad (3)$$

When y=0, namely, when the film thickness of the silicon nitride film 5 is "0" in the above equations (1), (2), and (3), ALD cycles are as follows.
Line I: 19 cycles (First Embodiment)
Line II: 15 cycles (Second Embodiment)
Line III: 24 cycles (Comparative Example)

Namely, in Comparative Example, the silicon nitride film 5 starts to grow after repeating the ALD cycles 24 times. Comparatively, in the first embodiment, the silicon nitride film 5 starts to grow after repeating the ALD cycles 19 times, and in the second embodiment, the silicon nitride film 5 starts to grow after repeating the ALD cycles 15 times, which is faster. In this manner, it is clearly noted that the silicon nitride films 5 in both of the first and second embodiments starts to grow at a faster stage than that in Comparative Example.

Accordingly, according to the first and second embodiments in which the seed layer 4 functioning as a seed of the silicon nitride film 5 the is formed on the surface of the silicon wafer W by using at least an aminosilane-based gas, prior to forming the silicon nitride film 5 on the surface of an object to be processed (i.e., the surface of the silicon oxide film 2 in the first and second embodiments), it is possible to shorten of the incubation duration of the silicon nitride film 5 in comparison to the case of forming the silicon nitride film 5 directly on the silicon oxide film 2.

Third Embodiment

A third embodiment relates to an example of a film forming apparatus which is able to perform the film forming method for forming the silicon nitride film according to the first and second embodiments.

Figure 5:
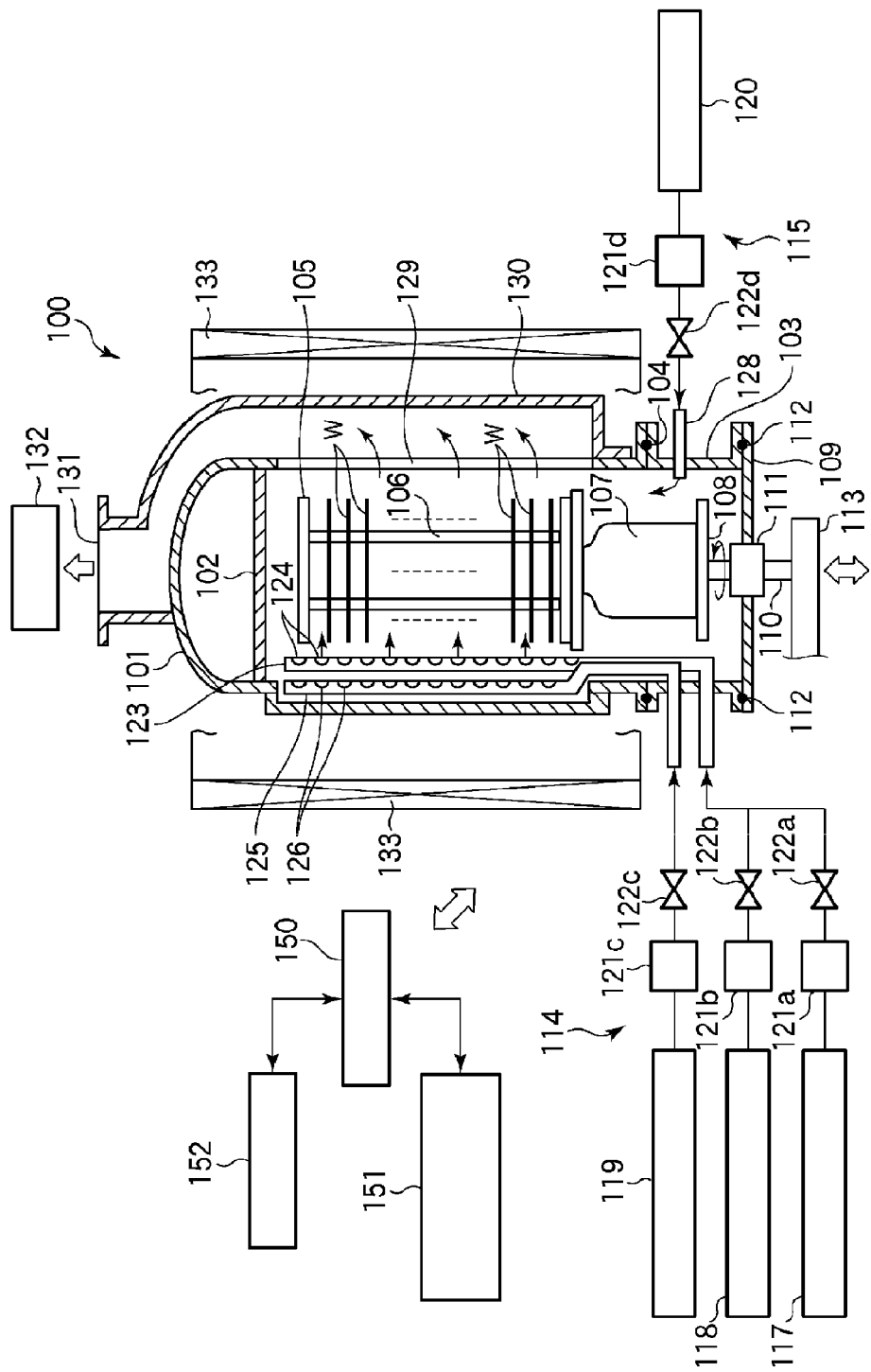
FIG. 5 is a cross-sectional view schematically showing an example of a film forming apparatus which is able to implement the film forming method for forming the silicon nitride film according to the first and second embodiments.

FIG. 5 is a cross-sectional view schematically showing an example of a film forming apparatus which is able to form the film forming method for forming the silicon nitride film according to the first and second embodiments.

As shown in FIG. 5, the film forming apparatus 100 includes a processing chamber 101 having a cylindrical shape with a ceiling and an opened lower end portion. The processing chamber 101 is entirely made of, for example, quartz. A ceiling plate 102 made of a quartz material is installed on the ceiling of the processing chamber 101. A manifold 103 molded to have, for example, a cylindrical shape and made of stainless steel is connected to the opening of the lower end portion of the processing chamber 101 with a sealing member 104 such as an O-ring, or the like interposed therebetween.

The manifold 103 supports the lower end portion of the processing chamber 101. A wafer boat 105 made of a quartz material and allowing multiple sheets as an object to be processed, e.g., 50 to 100 sheets of semiconductor wafers, which are silicon wafers W in this example, to be loaded by multiple stages thereon is formed to be inserted into the processing chamber 101 from a lower side of the manifold 103. The wafer boat 105 has a plurality of support pillars 106, and the plurality of sheets of silicon wafers W are supported by recesses formed on the support pillars 106.

The wafer boat 105 is loaded on the table 108 with a warm-retaining container 107 made of a quartz material interposed therebetween. The table 108 is supported, for example, on a rotational shaft 110 penetrating a cover unit 109 made of a stainless steel and opening and closing the opening of the lower end portion of the manifold 103. A magnetic fluid seal 111 is installed, for example, at the through portion of the rotational shaft 110, and rotatably supports the rotational shaft 110 while airtightly sealing the rotational shaft 110. A seal member 112, formed of, for example, an O-ring, is interposed between a peripheral portion of the cover unit 109 and the lower end portion of the manifold 103. Accordingly, sealing characteristics are retained and supported within the processing chamber 101. The rotational shaft 110 is installed, for example, at a front end of an arm 113 supported by a lifting mechanism (not shown) such as a boat elevator or the like. Accordingly, the wafer boat 105, the cover unit 109, and the like are integrally lifted or lowered to be inserted into and separated from the interior of the processing chamber 101.

The film forming apparatus 100 includes a processing gas supply mechanism 114 for supplying a gas used for process to the interior of the processing chamber 101 and an inert gas supply mechanism 115 for supplying an inert gas to the interior of the processing chamber 101.

The processing gas supply mechanism 114 includes an aminosilane-based gas supply source 117, a film formation gas supply source 118, and an ammonia-containing gas supply source 119. The film formation gas may be, for example, a silane-based gas.

The inert gas supply mechanism 115 includes an inert gas supply source 120. The inert gas is used as a purge gas, or the like.

The aminosilane-based gas supply source 117 is connected to a dispersion nozzle 123 through a flow rate controller 121a and a switching valve 122a. The dispersion nozzle 123 is formed of a quartz pipe, and bent upwardly so as to extend vertically through the interior of a side wall of the manifold 103. A plurality of gas discharge holes 124 are formed to be spaced apart on the vertical portion of the dispersion nozzle 123. An organic silicon gas is substantially evenly discharged toward the interior of the processing chamber 101 from the respective gas discharge holes 124 in a horizontal direction. Also, the film formation gas supply source 118 is also connected, for example, to the dispersion nozzle 123 through a flow rate controller 121b and a switching valve 122b.

The ammonia-containing gas supply source 119 is connected to a dispersion nozzle 125 through a flow rate controller 121c and an on-off valve 122c. The dispersion nozzle 125, which is formed of a quartz tube, extends vertically along the inside of the side wall of the manifold 103 while being curved upwards therealong. A plurality of gas injection opening 126 are formed to be spaced apart by a predetermined distance in a horizontal direction on a vertically formed portion in the dispersion nozzle 125. An ammonia-containing gas is substantially uniformly discharged toward the interior of the processing chamber 101 through the respective gas injection openings 126 in a horizontal direction.

The inert gas supply source 120 is connected to a nozzle 128 through a flow rate controller 121d and a switching valve 122d. The nozzle 128 penetrates a side wall of the manifold 103 and discharges an inert gas from a front end thereof toward the interior of the processing chamber 101 in a horizontal direction.

An exhaust pipe 129 for exhausting air within the processing chamber 101 is installed at a portion of the opposite side of the dispersion nozzles 123 and 125 within the processing chamber 101. The exhaust pipe 129 is formed to be thin and long by cutting out a side wall of the processing chamber 101 in a vertical direction. An exhaust pipe cover member 130 molded to have a U-shaped section to cover the exhaust pipe 129 is installed at a portion corresponding to the exhaust pipe 129 through welding. The exhaust pipe cover member 130 extends upwardly along the side wall of the processing chamber 101, and defines a gas outlet 131 at an upper portion of the processing chamber 101. An exhaust mechanism 132 including a vacuum pump, or the like is connected to the gas outlet 131. The exhaust mechanism 132 exhausts air within the processing chamber 101 to thus exhaust a processing gas used for process and allow the pressure within the processing chamber 101 to be a processing pressure according to processing.

A tube-shaped heating device 133 is installed at an outer circumference of the processing chamber 101. The heating device 133 activates gas supplied into the processing chamber 101 and heats an object to be processed, e.g., a semiconductor substrate (i.e., the wafer W in this example), accommodated within the processing chamber 101.

The respective components of the film forming apparatus 100 are controlled by a controller 150 formed of, for example, a microprocessor (computer). A user interface 151 configured as a keyboard for allowing an operator to perform an input manipulation of a command, or the like to manage the film forming apparatus 100, a display for visually displaying an actuation status of the film forming apparatus 100, or the like, is connected to the controller 150.

A memory unit 152 is connected to the controller 150. The memory unit 152 stores a control program for realizing various processing executed by the film forming apparatus 100 under the control of the controller 150, a program for executing the processing of each component of the film forming apparatus 100 depending on processing conditions, namely, recipe. The recipe is stored, for example, in a storage medium within the memory unit 152. The storage medium may be a hard disk or a semiconductor memory, or may be a transferable unit such as a CD-ROM, a DVD, a flash memory, or the like. Also, the recipe may be appropriately transmitted through, for example, a dedicated line from a different device. The recipe may be read from the memory unit 152 according to an instruction, or the like from the user interface 151 as necessary, and processing according to the read recipe may be executed by the controller 150, whereby the film forming apparatus 100 can perform desired processing under the control of the controller 150.

In this example, under the control of the controller 150, the processing according to step 1 to step 6 of the film forming method for forming the silicon nitride film according to the first embodiment or the processing according to step 11 to step 18 of the film forming method for forming the silicon nitride film according to the second embodiment are sequentially performed.

The film forming method for forming the silicon nitride film according to the first and second embodiments may be performed by the film forming apparatus 100 illustrated in FIG. 5.

Fourth Embodiment

A fourth embodiment relates to a single film forming process of a semiconductor device using the film forming method for forming the silicon nitride film according to the first or second embodiment.

FIGS. 6A to 6E are cross-sectional views showing an example of a single film forming process of a semiconductor device using the film forming method for forming the silicon nitride film according to the first or second embodiment.

An example of the film forming process is an example of forming a side wall spacer formed of the silicon nitride film 5 on a side wall of a gate electrode of a semiconductor device, in particular, a semiconductor integrated circuit device. Also, this example will be described by using the example of employing the film forming method for forming the silicon nitride film according to the first embodiment, but of course, the film forming method for forming the silicon nitride film according to the second embodiment may also be employed.

Figure 6A:
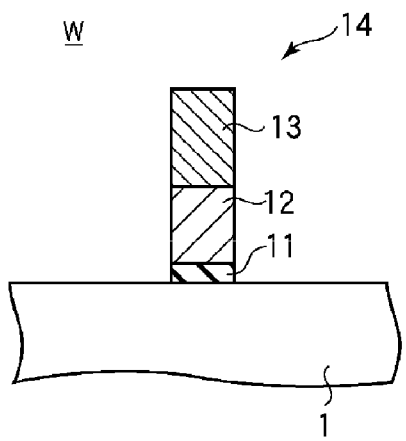
FIGS. 6A to 6E are a cross-sectional view illustrating an example of a film forming process of a semiconductor device using the film forming method for forming the silicon nitride film according to the first and second embodiments, respectively.

FIG. 6A illustrates an example of a section before forming the silicon nitride film 5. Namely, a gate electrode 14 is formed by sequentially forming a gate insulating film 11, a polysilicon layer 12, and a metal layer 13 on a silicon substrate 1. The gate insulating film 11 is made of, for example, silicon oxide ($SiO_2$), and the metal layer 13 is made of, for example, tungsten (W). An object to be processed including the structure illustrated in FIG. 6A is carried into, for example, the processing chamber 101 of the film forming apparatus 100 illustrated in FIG. 5. Subsequently, the temperature within the processing chamber 101 is increased to a silicon adsorption temperature, e.g., 450 degrees C.

Figure 6D:
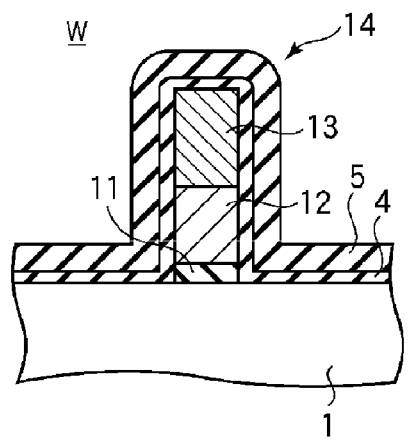
Figure 6B:
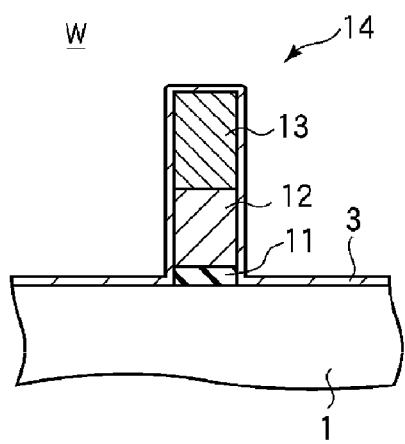

Next, as shown in FIG. 6B, an aminosilane-based gas is introduced into the processing chamber 101 at the silicon adsorption temperature, and silicon is adsorbed to side walls and an upper face of the gate electrode 14 and to the surface of the silicon substrate 1 (e.g., the silicon substrate having a natural oxide film (not shown) formed on the exposed face) to form the silicon adsorption layer 3. In this example, a diisopropylaminosilane (DIPAS) is used as the aminosilane-based gas. Thereafter, the interior of the processing chamber 101 is purged by using an inert gas, e.g., a nitrogen gas.

Figure 6E:
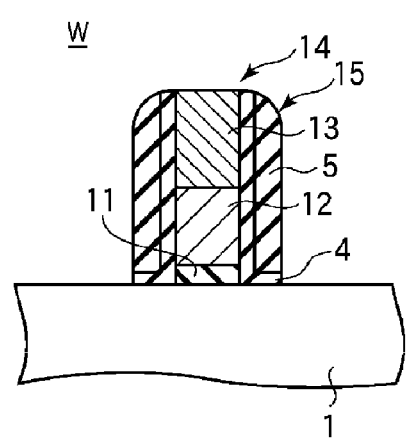
Figure 6C:
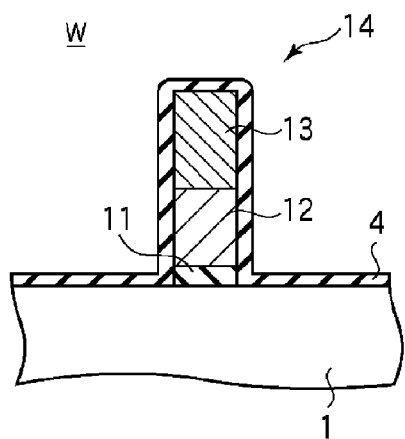

Subsequently, as shown in FIG. 6C, a gas including ammonia ($NH_3$) is introduced into the processing chamber 101, and an amino group (e.g., $NH_2$) is bonded to the silicon adsorption layer 3 to form the seed layer 4 on the side walls and upper face of the gate electrode 14 and the surface of the silicon substrate 1. At this time, the temperature within the processing chamber 101 is increased from the silicon adsorption temperature to a silicon nitride film formation temperature. Thereafter, the interior of the processing chamber 101 is purged by using an inert gas, e.g., a nitrogen gas.

And then, as shown in FIG. 6D, a film formation gas for forming a silicon nitride is introduced into the processing chamber 101 at the silicon nitride film formation temperature, and as shown in FIG. 2D, the silicon nitride film 5 is formed on the seed layer 4. In this example, the silicon nitride film 5 is formed by alternately supplying a gas including silicon and a gas including a nitrating agent as film formation gases, and depositing the silicon nitride on the seed layer 4. In this example, as the gas including silicon, a silane-based gas, e.g., DCS, is used, and as a gas including a nitrating agent, a gas including ammonia is used. The processes up to now are performed, for example, within the processing chamber 101 of the film forming apparatus 100 illustrated in FIG. 5.

Thereafter, as shown in FIG. 6E, the silicon wafer W configured as a structure illustrated in FIG. 6D is transferred out of the processing chamber 101 and then carried into a processing chamber of an anisotropic etching device. Here, the silicon nitride film 5 is anisotropic-etched to form a side wall spacer 15 formed of the silicon nitride film 5 on the side wall of the gate electrode 14.

In this manner, the film forming method for forming the silicon nitride film according to the first and second embodiments can be used for a fabrication process of the semiconductor integrated circuit device, e.g., a process for forming the side wall spacer 15 on the side wall of the gate electrode 14, or the like.

Some embodiments of the present invention have been described, but the present disclosure is not limited thereto and may be variably modified.

For example, in the foregoing embodiments, diisopropyl aminosilane (DIPAS) or tridimethylaminosilane (TDMAS) gas is used as the aminosilane-based gas, but the aminosilane-based gases given below may also be used besides the DIPAS and the TDMAS.

Butylaminosilane (BAS)
Bistertiarybutylaminosilane (BTBAS)
Dimethylaminosilane (DMAS)
Bisdimethylaminosilane (BDMAS)
Diethylaminosilane (DEAS)
Bisdiethylaminosilane (BDEAS), and
Dipropylaminosilane (DPAS)

In other embodiment, the aminosilane-based gas may include gas having one silicon (Si) atom in a molecular formula, but not limited thereto. In another embodiment, the aminosilane-based gas may include gas containing two silicon atoms in a molecular formula, for example, Hexakis (ethylamino)disilane ($C_{12}H_{36}N_6Si_2$) or the like.

Further, in other embodiments, substances expressed by the following chemical formulas (1) to (4) may be used:

$$(((R1R2)N)nSi_2H_6\text{-}n\text{-}m(R3)m \quad (1)$$

$$((R1)NH)nSi_2H_6\text{-}n\text{-}m(R3)m \quad (2)$$

where, n is an integer ranging from 1 to 6 and represents the number of amino group, and m is an integer ranging from zero to 5 and represents the number of alkyl group. R1, R2 and R3 may correspond to any one of $CH_3$, $C_2H_5$ and $C_3H_7$. In one embodiment, R1, R2 and R3 may be equal or different each other.

$$(((R1R2)N)nSi_2H_6\text{-}n\text{-}p(C1)p \quad (3)$$

$$((R1)NH)nSi_2H_6\text{-}n\text{-}p(C1)p \quad (4)$$

where, n is an integer ranging from 1 to 6 and represents the number of amino group, and p is an integer ranging from zero to 5 and represents the number of chlorine group. R1 and R2 may correspond to any one of $CH_3$, $C_2H_5$ and $C_3H_7$. In one embodiment, R1 and R2 may be equal or different each other Besides, the present disclosure can be variably modified without departing from the gist thereof According to the present disclosure in some embodiments, it is possible to provide a film forming method capable of forming a silicon nitride film having excellent physical characteristics and electrical characteristics although the silicon nitride film is in a very thin film state, and a film forming apparatus capable of performing the film forming method.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a silicon nitride film on the surface of an object to be processed, the method comprising:
    forming a seed layer functioning as a seed of the silicon nitride film on the surface of the object by using at least an aminosilane-based gas, followed by forming the silicon nitride film on the surface of the object, wherein the method comprising: (1) carrying an object to be processed into a processing chamber; (2) introducing an aminosilane-based gas into the processing chamber and adsorbing silicon to a surface of the object to be processed; (3) introducing a gas including ammonia into the processing chamber and forming a seed layer on the silicon-adsorbed surface of the object to be processed; and (4) introducing a film formation gas for forming a silicon nitride into the processing chamber and forming a silicon nitride film on the seed layer.

2. The method of claim 1, wherein, in the step (3), a temperature within the processing chamber is increased up to a temperature at which the silicon nitride film is formed.

3. The method of claim 1, wherein the steps (2) and (3) are repeatedly performed.

4. The method of claim 3, further comprising, after the repetitive performance of the step (2) and step (3) and before the step (4):

(5) increasing the temperature within the processing chamber up to the temperature at which the silicon nitride film is formed, while purging the interior of the processing chamber.

5. The method of claim 1, wherein the step (4) includes alternately supplying a silicon-containing gas and a nitrating agent-containing gas into the processing chamber to deposit a silicon nitride on the seed layer.

6. The method of claim 1, wherein the step (4) includes simultaneous supplying a silicon-containing gas and a nitrating agent-containing gas into the processing chamber to deposit a silicon nitride on the seed layer.

7. The method of claim 1, wherein the surface of the object includes at least a region having a main component of silicon and a region having a main component of metal.

8. The method of claim 1, wherein the aminosilane-based gas includes at least one selected from the group consisting of butylaminosilane (BAS), a bistertiarybutylaminosilane (BTBAS), dimethylaminosilane (DMAS), bis dimethylaminosilane (BDMAS), a tridimethylaminesilane (TDMAS), diethyl amonisilane (DEAS), bis diethylaminosilane (BDEAS), dipropylaminosilane (DPAS), diisopropylaminosilane (DIPAS), and hexakis(ethylamino)disilane,
    wherein the hexakis(ethylamino)disilane is expressed by any one of the following chemical formulas:

$$(((R1R2)N)nSi2H6\text{-}n\text{-}m(R3)m \qquad (1)$$

$$((R1)NH)nSi2H6\text{-}n\text{-}m(R3)m \qquad (2)$$

where, n is an integer ranging from 1 to 6 and represents the number of amino group, and m is an integer ranging from zero to 5 and represents the number of alkyl group, and R1, R2 and R3 being equal or different each other and correspond to any one of $CH_3$, $C_2H_5$ and $C_3H_7$,

$$(((R1R2)N)nSi_2H_6\text{-}n\text{-}p(C1)p \qquad (3)$$

$$((R1)NH)nSi_2H_6\text{-}n\text{-}p(C1)p \qquad (4)$$

where, n is an integer ranging from 1 to 6 and represents the number of amino group, and p is an integer ranging from zero to 5 and represents the number of chlorine group, and R1 and R2 being equal or different each other and correspond to any one of $CH_3$, $C_2H_5$ and $C_3H_7$.

* * * * *